(12) United States Patent
Kato

(10) Patent No.: US 7,397,126 B2
(45) Date of Patent: Jul. 8, 2008

(54) SEMICONDUCTOR DEVICE

(75) Inventor: Tomoki Kato, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 21 days.

(21) Appl. No.: 11/236,563

(22) Filed: Sep. 28, 2005

(65) Prior Publication Data

US 2006/0071309 A1 Apr. 6, 2006

(30) Foreign Application Priority Data

Sep. 29, 2004 (JP) ............... 2004-283292

(51) Int. Cl.
*H01L 23/48* (2006.01)
*H01L 23/52* (2006.01)
*H01L 29/40* (2006.01)

(52) U.S. Cl. ............ 257/767; 257/622; 257/629; 257/632; 257/638; 257/135; 257/153; 257/177; 257/E29.118; 257/E29.122; 257/E29.13

(58) Field of Classification Search .......... None
See application file for complete search history.

(56) References Cited

U.S. PATENT DOCUMENTS

| 2001/0001427 A1* | 5/2001 | Atakov et al. ........... 174/113 R |
| 2001/0011761 A1* | 8/2001 | Imoto ..................... 257/638 |
| 2002/0101754 A1* | 8/2002 | Hidaka et al. ............ 365/51 |
| 2004/0094841 A1* | 5/2004 | Matsuzaki et al. ........ 257/758 |
| 2005/0023670 A1* | 2/2005 | Hata et al. .............. 257/690 |

FOREIGN PATENT DOCUMENTS

| JP | 9-148520 | 6/1997 |
| JP | 2001-274206 | 10/2001 |

* cited by examiner

*Primary Examiner*—Minh-Loan Tran
*Assistant Examiner*—Leslie Pilar Cruz
(74) *Attorney, Agent, or Firm*—McGinn IP Law Group, PLLC

(57) ABSTRACT

The present invention provides inhibiting an electrical leakage caused by anion migration. A trenched portion 15 is provided as ion migration-preventing zone between a source electrode 4 and a gate electrode 5. The trenched portion 15 is formed so as to surround a periphery of the source electrode 4.

15 Claims, 7 Drawing Sheets

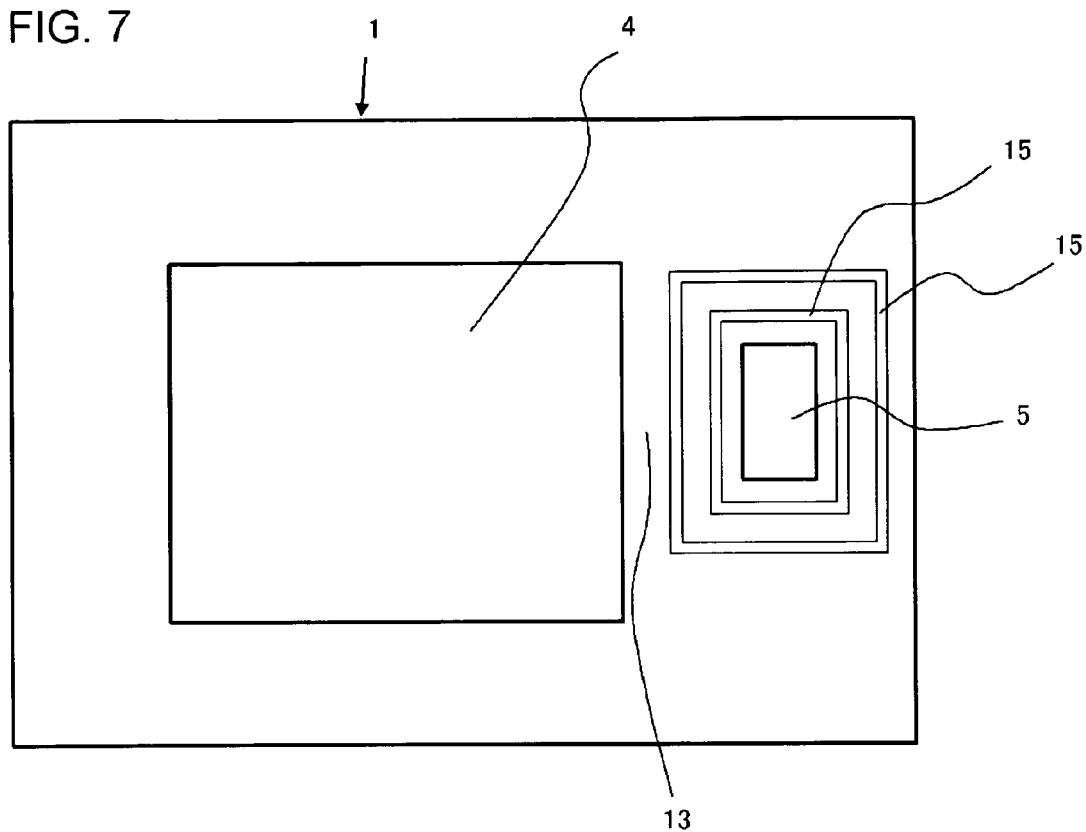

SEMICONDUCTOR DEVICE

This application is based on Japanese patent application NO. 2004-283292, the content of which is incorporated hereinto by reference.

BACKGROUND OF THE INVENTION

1. Technical Field

The present invention relates to a semiconductor device comprising a semiconductor chip, and relates, in particular, to a semiconductor device having an insulated gate field effect transistor mounted thereon.

2. Related Art

An exemplary conventional technology related to a semiconductor device having a power MOSFET mounted thereon is disclosed in Japanese Patent Laid-Open No. 2001-274,206 (pp. 3 to pp. 4, FIG. 1 and FIG. 2). FIG. 8 is a plan view of a power MOSFET mounted on a semiconductor package described in Japanese Patent Laid-Open No. 2001-274,206, FIG. 9 is a cross-sectional view thereof along line A-A and FIG. 10 is an enlarged cross-sectional view of a portion thereof between electrodes. A semiconductor chip 101 of the power MOSFET is mounted on an island 103 of a lead frame 102, and an upper surface of the semiconductor chip 101 is provided with a source electrode 104 and a gate electrode 105 of a transistor formed thereon, which are composed of aluminum or aluminum alloy. The lower surface of the semiconductor chip 101 is provided with a drain terminal (not shown), which is coupled to the island 103. Clip-shaped metallic plates 108 and 109 composed of copper belt or copper alloy foil are employed as coupling conductors for electrically coupling the source electrode 104 and the gate electrode 105 to a source lead 106 and a gate lead 107, respectively, and the source electrode 104 and the gate electrode 105 are joined to the clip-shaped metallic plates 108 and 109, respectively, through electrically conducting pastes 110. In addition, the other ends of the clip-shaped metallic plates 108 and 109 are also electrically coupled to the source lead 106 and the gate lead 107, respectively, through the electrically conducting paste 110. Then, the semiconductor chip 101 is encapsulated with a resin 112, together with the island 103, the source lead 106, the gate lead 107 and the drain lead 111. Normally, the source electrode 104 is electrically isolated from the gate electrode 105 by an insulating cover film 113 composed of silicon nitride, phosphorus glass and the like. Only a certain range of materials limited to a certain extent may be selected for the metal composing the outermost surfaces of the source electrode 104 and the gate electrode 105, in order to provide a better coupling to an external terminal. In particular, electrode materials such as Ag, Cu, Pb—Sn and the like are selected, when a coupling with an electrically conducting paste material or a junction employing solder is provided in place of providing an ordinary coupling with a bonding line of gold or aluminum.

However, since the electrode material such as Ag, Cu, Pb—Sn and the like is a material that is more likely to cause so-called metallic ion migration as compared with Al, in which metallic ion moves toward a region having lower electric potential when there is a gradient in the electric potential at higher temperature in a highly humid condition, as disclosed in Japanese Patent Laid-Open No. H09-148,520 (1997) (pp. 2 to pp. 3), a material composing an electrode in the side of higher potential that is located in the side of the anode is ionized and moved therefrom, and then is precipitated and grown up at an electrode in the side of lower potential that is located in the side of the cathode, when a current test is conducted at higher temperature in a highly humid condition under the status of applying an electrical voltage between the electrodes, thereby providing a condition of easily causing defective situations that may lead to an electrical leakage and/or a short circuit.

SUMMARY OF THE INVENTION

The present invention is made on the basis of such circumstances, and the present invention is to provide a technology for inhibiting an electrical leakage or the like due to an ion migration.

According to one aspect of the present invention, there is provided a semiconductor device, comprising: a semiconductor chip; a plurality of electrodes provided on a surface of the semiconductor chip; and an ion migration-preventing zone provided between an electrode in a side of higher potential and an electrode in a side of lower electric potential among the plurality of electrodes, the electrodes being mutually adjacent.

The semiconductor device according to the present invention includes an ion migration-preventing zone provided between the electrode in the side of higher potential and the electrode in the side of lower electric potential. The ion migration-preventing zone is a region having a function of inhibiting a transfer of ion along an electric field created between the electrode in the side of higher potential and the electrode in the side of lower potential. A specific configuration of a typical ion migration-preventing zone may be an insulator having a trenched portion provided between the electrode in the side of higher potential and the electrode in the side of lower potential. Since such ion migration-preventing zone is provided in the configuration according to the present invention, an electrical leakage and/or a short circuit due to an ion migration can be effectively inhibited.

According to the present invention, an electrical leakage and/or a short circuit due to an ion migration can be effectively inhibited by providing the ion migration-preventing zone.

BRIEF DESCRIPTION OF THE DRAWINGS

The above and other objects, advantages and features of the present invention will be more apparent from the following description taken in conjunction with the accompanying drawings, in which:

FIG. 7 is a plan view of the semiconductor chip portion of the semiconductor device according to the embodiment;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

In the present embodiment, an exemplary implementation, in which a plurality of trenches are formed as an ion migration-preventing zone, will be described.

Figure 1:
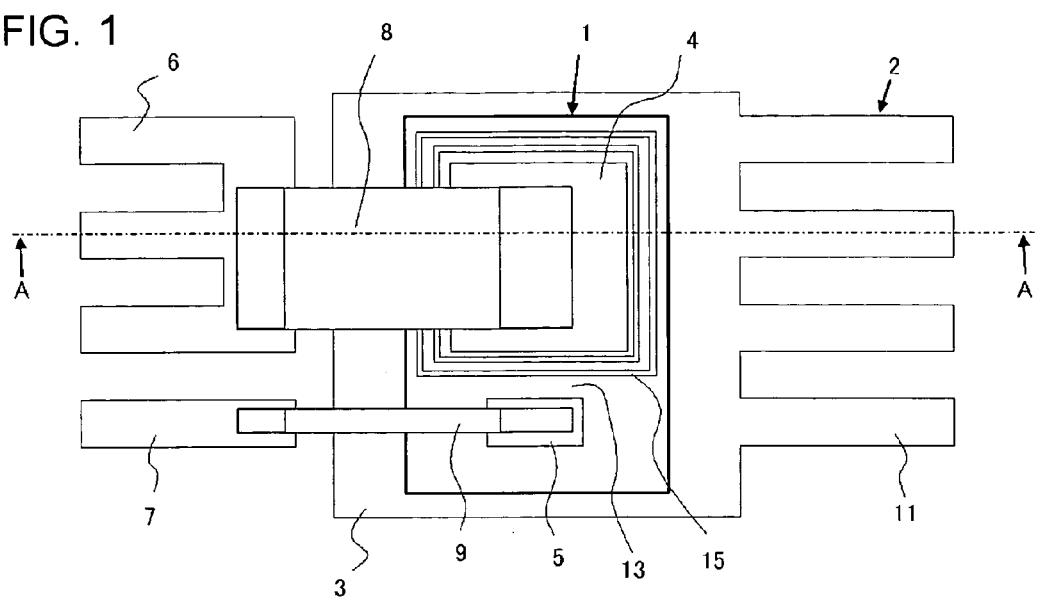
FIG. 1 is a plan view of a semiconductor device according to an embodiment.
Figure 2:
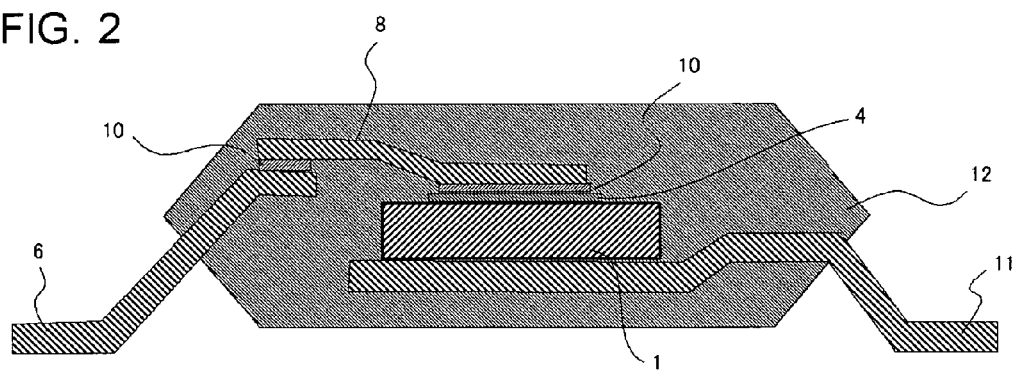
FIG. 2 is a cross-sectional view of the semiconductor device according to the embodiment.
Figure 3:
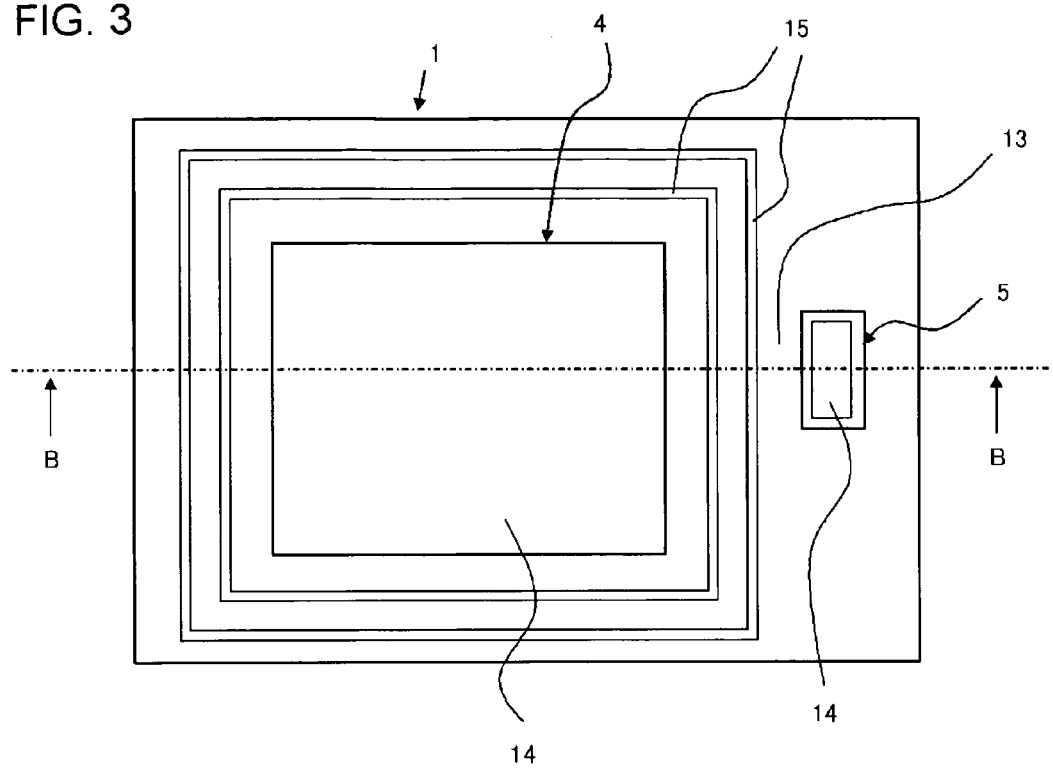
FIG. 3 is a plan view of the semiconductor chip shown in FIG. 1.
Figure 4:
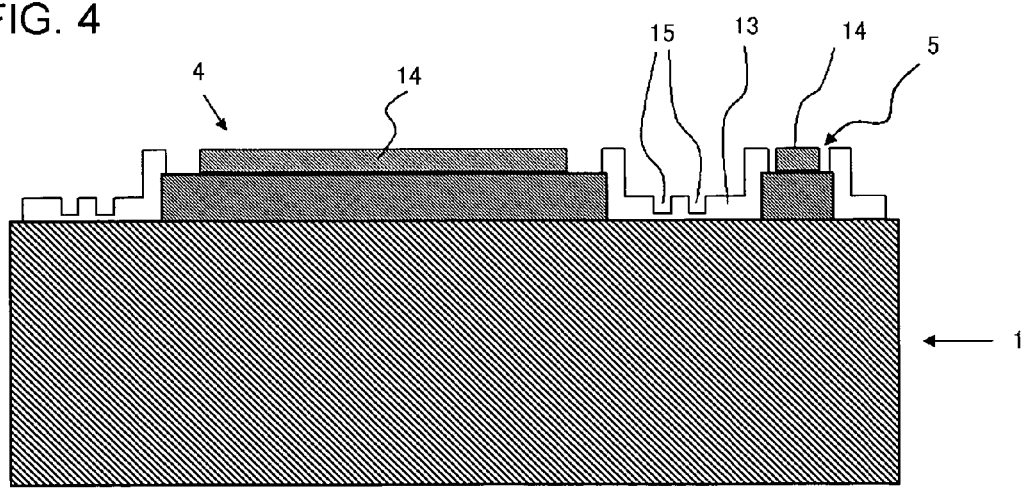
FIG. 4 is a cross-sectional view of the semiconductor chip shown in FIG. 3.

FIG. 1 is a plan view of a semiconductor device according to the present embodiment. FIG. 2 is a cross-sectional view of the semiconductor device shown in FIG. 1 along line A-A. FIG. 3 is a plan view of a semiconductor chip 1 shown in FIG. 1, and FIG. 4 is a cross-sectional view of the chip 1 shown in FIG. 3 along line B-B.

The semiconductor device according to the present embodiment has a two-dimensional structure as shown in FIG. 1. A semiconductor chip 1 of a power MOSFET, which is one kind of an insulated gate field effect transistor, is mounted on an island 3 of a lead frame 2, and a source electrode 4 and a gate electrode 5 of the transistor are formed on an upper surface of the semiconductor chip 1. These metallic electrodes are formed of aluminum or aluminum alloy. A silver layer 14 is formed on the surface of these electrodes, as shown in FIG. 3 and FIG. 4. The silver layer 14 may be formed via, for example, a vacuum evaporation process.

A drain terminal (not shown) is provided on a lower surface of the semiconductor chip 1. The drain terminal is coupled to the island 3.

Clip-shaped metallic plates 8 and 9 composed of a copper belt, a copper alloy foil or the like are employed as coupling conductors, which provide electrical couplings of the source electrode 4 and the gate electrode 5 to the source lead 6 and the gate lead 7, respectively, such that the source electrode 4 and the gate electrode 5 are coupled to these clip-shaped metallic plates through electrically conducting pastes 10, respectively. In addition, the other ends of the clip-shaped metallic plate 8 and 9 are coupled to the source lead 6 and the gate lead 7 through electrically conducting pastes 10, respectively.

The semiconductor chip 1 including the island 3, the source lead 6, the gate lead 7 and the drain lead 11 is encapsulated with a resin 12. An electrical isolation is provided between the source electrode 4 and the gate electrode 5 with an insulating cover film 13 composed of a material such as silicon nitride, phosphorus glass and the like. As have been described in the above description related to the prior art, a material such as Ag, Cu, Pb—Sn and the like may be selected for the metallic material of the outermost surface of the source electrode 4 and the gate electrode 5, in order to establish better electrical coupling with an external terminal.

A trenched portion 15 is provided between the source electrode 4 and the gate electrode 5. The trenched portion 15 may be formed by selectively removing a portion of the insulating cover film 13 composed of silicon nitride, phosphorus glass or the like via a dry etch process or a wet etch process. The trenched portion 15 includes two trenches provided in parallel along a direction dividing the source electrode 4 from the gate electrode 5, and each of the trenches includes a wall that is substantially perpendicular to a direction of an electric field created between the source electrode 4 and the gate electrode 5. The respective trenches are provided to respectively surround the peripheral portion of the source electrode 4. The interior of the trenched portion 15 is filled with the encapsulating resin 12.

Advantageous effects obtainable by employing the configuration of the semiconductor device according to the present embodiment will be described as follows.

In the semiconductor device according to the present embodiment, the portion provided with the trenched portion 15 functions as the ion migration-preventing zone. When an anodic potential is applied to the source electrode 4 that functions as an electrode in the side of higher potential and a cathodic potential is applied to the gate electrode 5 that functions as an electrode in the side of lower potential, metallic ion created by the ion migration is transferred through the surface of the insulating cover film 13 along an interface of the insulating cover film 13 with the encapsulating resin 12 from the source electrode 4 in the anode side toward the gate electrode 5 in the cathode side.

In such situation, the presence of the trenched portion 15 provides an increased effective transfer length of the metallic ion. Further, since the direction of the wall of the trenched portion 15 is substantially perpendicular to a direction of the electric field extending from the side of the cathode to the side of the anode, there is no electric field that promotes transferring the metallic ion along any direction on the wall of the trenched portion 15 or even if there is an electric field, the strength of the field is extremely weak, and thus this allows to considerably reduce the transferring rate of the metallic ion.

The metal composing the outermost surfaces of the source electrode 4 and the gate electrode 5 are composed of silver, copper or the like, in order to provide a better coupling to an external terminal. However, in the case of silver, for example, an electrolysis thereof is caused due to an existence of water that is adsorbed in the surface thereof from an atmosphere to produce silver ion $Ag^+$. The metallic ion thus ionized ($Ag^+$, $Cu^+$ or the like) is transferred along the interface between the insulating cover film 13 and the encapsulating resin 12 from the electrode in the anode side to the electrode in the cathode side, due to the electric field created between the adjacent electrodes, and eventually dendritic silver is precipitated on the electrode in the cathode side or on the cover film. Since the ion migration-preventing zone is provided between the electrode in the side of higher potential that is located in the side of the anode and the electrode in the side of lower potential that is located in the side of the cathode in the configuration according to the present embodiment, the generation of the ion migration can be prevented, even if a current test for applying an electrical voltage between the electrodes of the semiconductor chip 1 in a condition at an elevated temperature in a highly humid atmosphere, and therefore an electrical leakage and/or a short circuit due to the ion migration can be effectively reduced.

Second Embodiment

An exemplary implementation being provided with a trench having a wall of an overhanging geometry as an ion migration-preventing zone will be described in the present embodiment.

Figure 5:
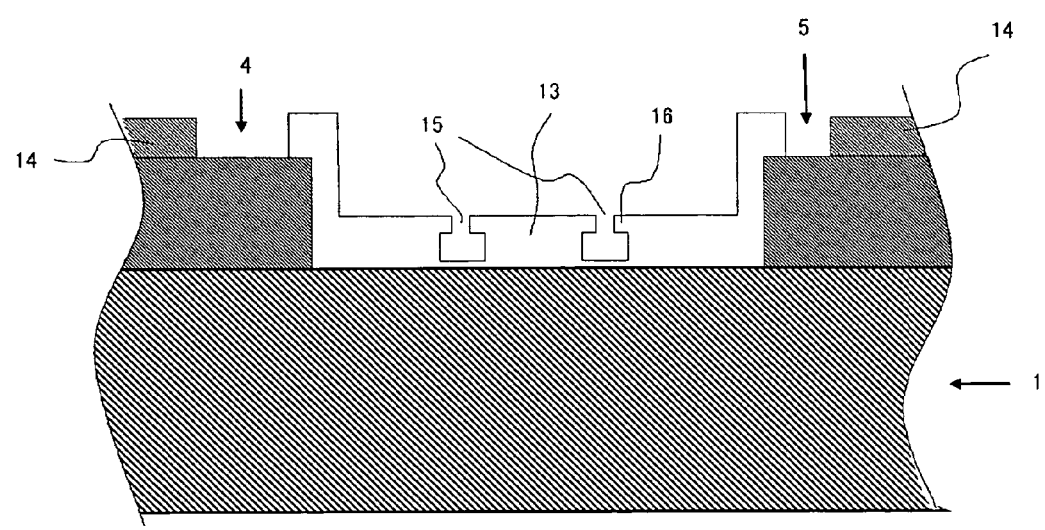
FIG. 5 is a cross-sectional view, showing an example of a cross section structure of an ion migration-preventing zone.

FIG. 5 shows a cross sectional structure of an ion migration-preventing zone according to the present embodiment.

A trenched portion 15 may be formed by selectively removing a portion of an insulating cover film 13. The trenched portion 15 is formed to include two trenches extending in parallel along a direction dividing the source electrode 4 from the gate electrode 5, similarly as in first embodiment, and each the trenches is provided to surround the periphery of the source electrode 4. The trenched portion 15 is formed to have a cross section of an overhanging geometry, as shown in FIG. 5. In other words, the trench width of the trenched portion 15 in the side of the substrate is larger than the trench width in the side of the surface thereof. The interior of the trenched portion 15 is filled with the encapsulating resin 12.

FIGS. 6A to 6E are cross sectional views of a semiconductor device, presented for describing a method for forming the trench having the overhanging-shaped wall as described above. A silicon layer 50, and a multi-layered film composed of a first insulating film 52 and a second insulating film 54, appeared in any of FIGS. 6A to 6E, correspond to the insulating cover film 13 in FIG. 5.

Figure 6A:
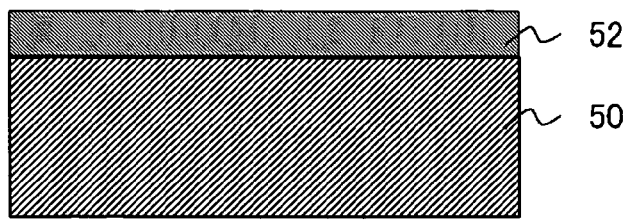
FIGS. 6A to 6E are cross sectional views of a semiconductor device, presented for describing a method for the semiconductor device according to the embodiment.

First, as shown in FIG. 6A, a first insulating film 52 is formed on a silicon layer 50. The silicon layer 50 is a film to be utilized as a base film. The first insulating film 52 may be formed of SiO2, phospho-silicate glass (PSG) or the like, which is capable of being etched with hydrofluoric acid.

Figure 6B:
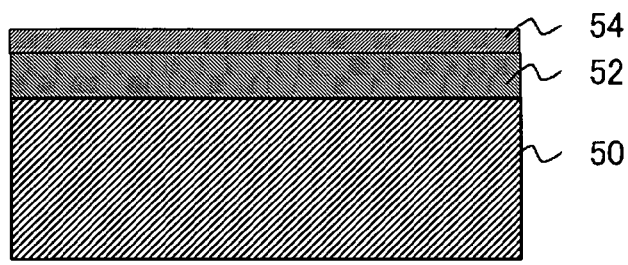

Then, as shown in FIG. 6B, the second insulating film 54 is formed on the first insulating film 52. The second insulating film 54 may be formed of SiN or the like, which is not susceptible to an etch with hydrofluoric acid.

Figure 6C:
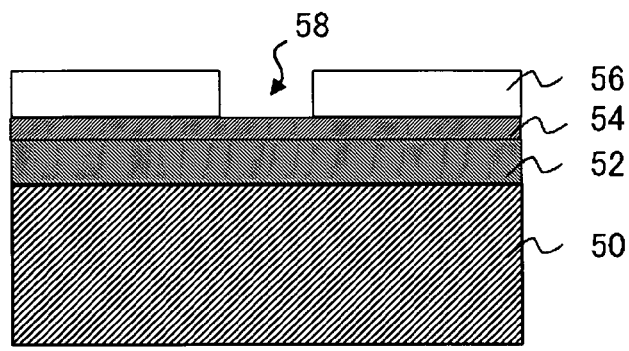
Figure 6D:
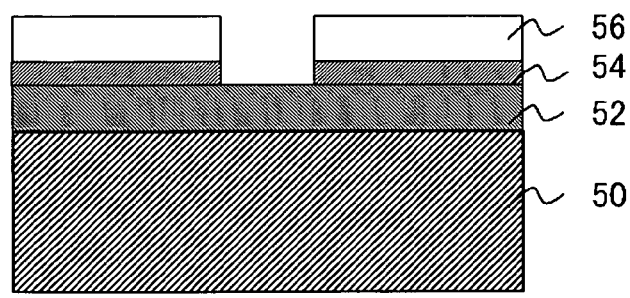
Figure 6E:
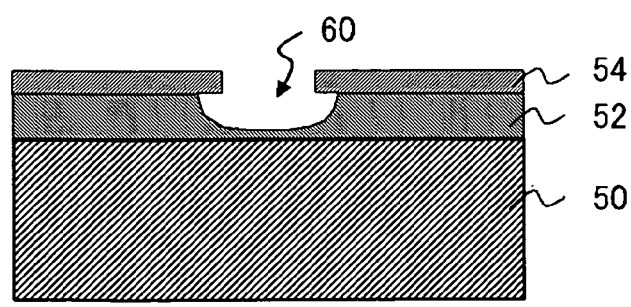
Figure 8:
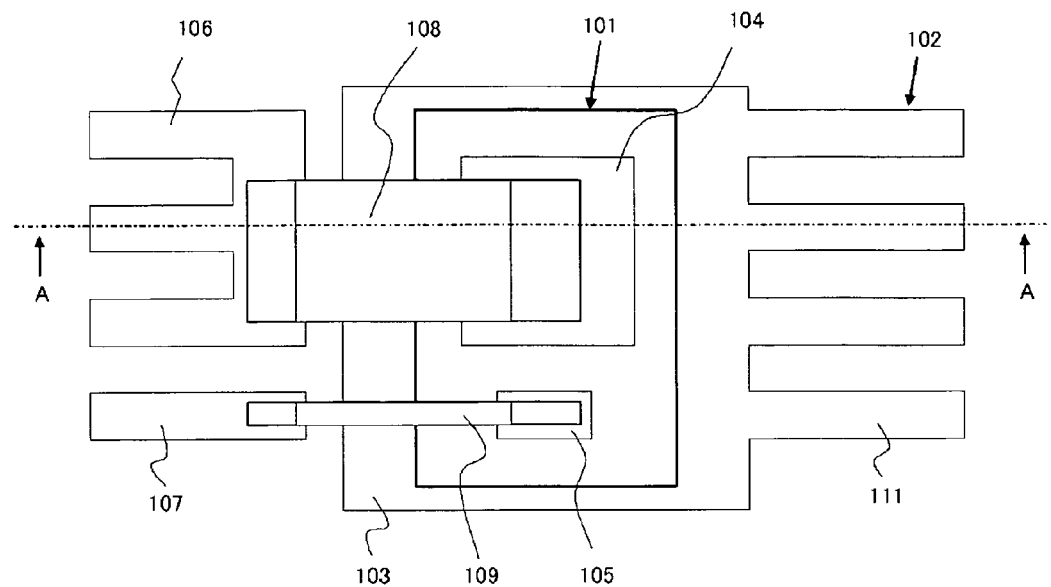
FIG. 8 is a plan view of a conventional semiconductor device.
Figure 9:
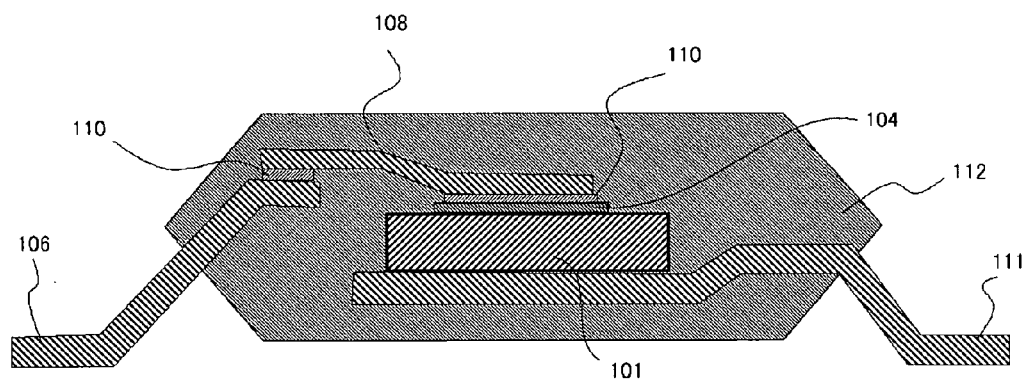
FIG. 9 is cross-sectional view of semiconductor device shown in FIG. 8 along line A-A.
Figure 10:
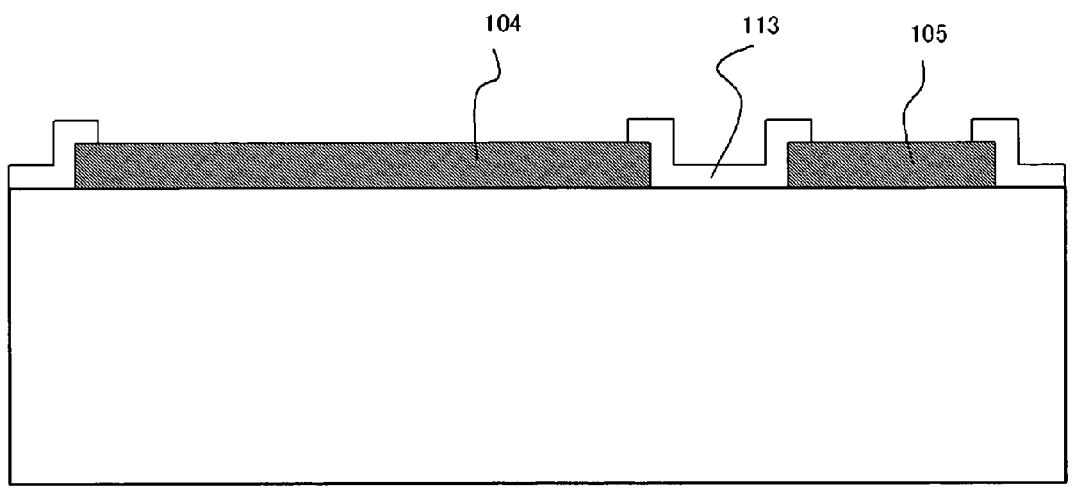
FIG. 10 is an enlarged cross-sectional view of a portion between electrodes in the semiconductor device show in FIG. 8.

Subsequently, as shown in FIG. 6C, a resist 56 having an opening 58 is formed on the second insulating film 54. The second insulating film 54 is selectively removed through the mask of the resist 56 via a dry etching process to form an opening having an exposed surface of the first insulating film 52 on the bottom thereof (FIG. 6D). The resist 56 is stripped via an ashing process, and thereafter, the first insulating film 52 is wet etched through the mask of the second insulating film 54, which has been provided with the opening in the previous process. While suitable etchant solution may be selected depending on the material of the first insulating film 52, buffered hydrofluoric acid is employed here. Since a side etch proceeds in the first insulating film 52 by the wet etch process, a concave portion 60 having a cup-shaped cross section is formed, as shown in FIG. 6E.

As stated above, the trench having a wall of the overhanging geometry is formed as combining the opening formed in the second insulating film 54 and the concave portion 60 formed in the first insulating film 52.

In the semiconductor device according to the present embodiment, the portion provided with the trenched portion 15 functions as the ion migration-preventing zone. Since no electric field is formed on the lower surface of the overhanging portion 16 along the direction for transferring the metallic ion toward an orientation opposite to the direction to the upper surface in the configuration of the present embodiment, it is difficult in principle that the metallic ion passes over the lower surface of the overhanging portion 16. Accordingly, the advantageous effect of preventing from transferring the metallic ion toward the cathode side can be further enhanced by providing the overhanging portion 16.

Third Embodiment

An exemplary implementation being provided with a trench surrounding the gate electrode as an ion migration-preventing zone will be described in the present embodiment. FIG. 7 is a plan view of a semiconductor chip portion of a semiconductor device according to the present embodiment. Basic structure of the semiconductor device according to the present embodiment is similar to that described in first embodiment, except for only a form of a trenched portion 15.

It is sufficient to provide the ion migration-preventing zone between the electrode in the side of higher potential having an anodic potential and the electrode in the side of lower potential having a cathodic potential within a region in vicinity of these electrodes. Thus, although it is not necessary that the preventing zone is provided as a guard ring so as to surround the electrodes as illustrated in first embodiment and second embodiment, a formation of a guard ring allows to provide further complete prevention from the generation of the migration in all orientations. While the guard ring may be formed to surround the source electrode 4 in the side of the anode as in first embodiment, when the guard ring is formed so as to surround the gate electrode 5 in the cathode side as illustrated in the present embodiment, the region for forming the guard ring-shaped trenched portion 15 can be reduced as compared with the case of first embodiment, since the gate electrode 5 has smaller area than the source electrode 4.

While the preferred embodiments of the present invention have been described above in reference to the annexed figures, it should be understood that the disclosures above are presented for the purpose of illustrating the present invention, and various configurations other than the above-described configurations can also be adopted.

For example, while the example of the insulator provided with the trenches as the ion migration-preventing zone is described in the above-described embodiment, configurations other than such configuration may also be adopted. The ion migration preventing-zone is a region having a function to inhibit the transfer of ion, and for example, a convex structure may be adopted instead of the form of the trench. For example, a convex structure (ridge) may be provided so as to surround the periphery of either the electrode in the side of higher potential or the electrode in the side of lower potential.

Further, when the insulator provided with the trenches as the ion migration-preventing zone is employed, various forms for providing the trenches may also be adopted. For example, a configuration of providing stripe-shaped trenches between the electrodes for providing an isolation to each of the electrodes may also be employed, without employing the configuration of surrounding the periphery of the electrode.

It is apparent that the present invention is not limited to the above embodiment, that may be modified and changed without departing from the scope and spirit of the invention.

What is claimed is:

1. A semiconductor device, comprising:
   a first electrode;
   a second electrode adjacent to said first electrode; and
   an insulator cover film covering a part of said first electrode and formed between said first electrode and said second electrode, said insulator cover film including a trench that forms a ring surrounding said first electrode and has two trench side walls, each of said two trench side walls having a portion that is substantially perpendicular to a direction extending from said first electrode to said second electrode.

2. The device of claim 1, further comprising an encapsulating resin.

3. The device of claim 2, wherein each said wall comprises a surface between said insulating cover film and said encapsulating resin.

4. The device of claim 1, wherein each said wall is formed by an insulator cover film having a ridge between the first electrode and the second electrode.

5. The device of claim 1, wherein each said wall comprises an overhanging geometry.

6. The device of claim 1, wherein each said wall comprises a plurality of walls that are substantially perpendicular to a direction extending from said first electrode to said second electrode.

7. A semiconductor device, comprising:
a semiconductor chip;
a plurality of electrodes provided on a surface of said semiconductor chip; and
an ion migration-inhibiting zone provided between an electrode in a side of higher potential and an electrode in a side of lower electric potential among said plurality of electrodes, said electrodes being mutually adjacent,
wherein said ion migration-inhibiting zone comprises a wall that is substantially perpendicular to a direction extending from the higher potential electrode to the lower potential electrode, and
wherein said wall is formed by an insulator having a trenched portion provided therein between said electrode in the side of higher potential and said electrode in the side of lower potential, the region having said trenched portion comprising said ion migration-preventing zone, said wall of said trenched portion further comprising an overhanging geometry.

8. The semiconductor device according to claim 7, wherein said trenched portion separates said electrode in the side of higher potential from said electrode in the side of lower potential.

9. The semiconductor device according to claim 7, wherein said trenched portion comprises a plurality of parallely provided trenches.

10. The semiconductor device according to claim 7, wherein said electrode in the side of higher potential comprises silver, and said electrode in the side of lower potential comprises aluminum.

11. The semiconductor device according to claim 7, wherein said ion migration-inhibiting zone encloses either said electrode in the side of higher potential or said electrode in the side of lower potential.

12. The semiconductor device according to claim 7, wherein said semiconductor chip further comprises an insulated gate field effect transistor, said electrode in the side of higher potential comprises a source electrode of said insulated gate field effect transistor, and said electrode in the side of lower potential comprises a gate electrode of said insulated gate field effect transistor.

13. The device of claim 7, wherein said wall is formed by an insulator having a ridge between said higher potential electrode and said lower potential electrode.

14. The device of claim 7, wherein said wall further comprises an overhanging-shaped wall.

15. The device of claim 14, further comprising an insulating cover film and an encapsulating resin, wherein said wall comprises a surface between said insulating cover film and said encapsulating resin.

* * * * *